(12) United States Patent
Lebrun

(10) Patent No.: US 12,374,665 B2
(45) Date of Patent: Jul. 29, 2025

(54) MICRO-LED DISPLAY EMITTING THROUGH THE ACTIVE MATRIX

(71) Applicant: THALES, Courbevoie (FR)

(72) Inventor: Hugues Lebrun, Coublevie (FR)

(73) Assignee: THALES, Courbevoie (FR)

( * ) Notice: Subject to any disclaimer, the term of this patent is extended or adjusted under 35 U.S.C. 154(b) by 495 days.

(21) Appl. No.: 17/789,133

(22) PCT Filed: Dec. 16, 2020

(86) PCT No.: PCT/EP2020/086372
§ 371 (c)(1),
(2) Date: Jun. 24, 2022

(87) PCT Pub. No.: WO2021/130073
PCT Pub. Date: Jul. 1, 2021

(65) Prior Publication Data
US 2023/0106746 A1    Apr. 6, 2023

(30) Foreign Application Priority Data

Dec. 26, 2019 (FR) ........................................ 1915601

(51) Int. Cl.
*H01L 25/075* (2006.01)
*H10H 20/857* (2025.01)

(52) U.S. Cl.
CPC ....... *H01L 25/0753* (2013.01); *H10H 20/857* (2025.01)

(58) Field of Classification Search
CPC .............................. H01L 25/0753; H01L 33/62
See application file for complete search history.

(56) References Cited

U.S. PATENT DOCUMENTS

| | | | |
|---|---|---|---|
| 2017/0179192 A1* | 6/2017 | Zhang | ..................... H01L 25/50 |
| 2017/0194304 A1 | 7/2017 | Takeya et al. | |
| 2019/0148409 A1 | 5/2019 | Bang | |
| 2019/0214373 A1* | 7/2019 | Kim | ..................... H01L 25/0756 |
| 2020/0373281 A1* | 11/2020 | Ruan | ..................... H10H 20/855 |
| 2021/0217805 A1* | 7/2021 | Kusunoki | ............. H10H 20/01 |
| 2021/0398952 A1* | 12/2021 | Zhang | .................... H10D 86/60 |
| 2022/0028841 A1* | 1/2022 | Kishimoto | .......... H01L 25/0753 |
| 2022/0029059 A1* | 1/2022 | Kishimoto | ............ H01L 25/167 |
| 2022/0093579 A1* | 3/2022 | Kishimoto | ........... H10H 20/018 |
| 2022/0165925 A1* | 5/2022 | Kishimoto | ........... H10H 20/856 |

* cited by examiner

*Primary Examiner* — Victor A Mandala
(74) *Attorney, Agent, or Firm* — BakerHostetler

(57) ABSTRACT

A display includes a plurality of electronic chips with μLEDs and an active matrix for controlling the chips, the active matrix being mounted on a transparent slide, each chip comprising a plurality of light-emitting diodes, each chip comprising a substrate comprising an electrode which is common to the μLEDs and, on the upper portion thereof, the μLEDs and their electrical control contacts. The display comprises: one or more power supply planes arranged on the upper face of a support plate; the plurality of electronic chips, first conductive elements providing the electrical connections between the common electrodes of each chip and the power supply planes; the transparent slide bearing the active matrix, second conductive elements providing the electrical connections between the electrical contacts of the electronic chips and the electrical contacts for controlling the active matrix.

18 Claims, 2 Drawing Sheets

MICRO-LED DISPLAY EMITTING THROUGH THE ACTIVE MATRIX

CROSS-REFERENCE TO RELATED APPLICATIONS

This application is a National Stage of International patent application PCT/EP2020/086372, filed on Dec. 16, 2020, which claims priority to foreign French patent application No. FR 1915601, filed on Dec. 26, 2019, the disclosures of which are incorporated by reference in their entirety.

FIELD OF THE INVENTION

The field of the invention is that of flat-screen displays. Currently, there are two main types of display technologies. The first technology consists in implementing a liquid crystal matrix illuminated by light-emitting diodes or "LEDs" whose lighting is constant. The liquid crystal cell acts as a spatial intensity modulator to form the image.

BACKGROUND

The second technology consists in implementing a matrix of light-emitting diodes made of organic material, or "OLEDs", to directly form the image. More precisely, an elementary color pixel of the image consists of three diodes emitting in three different colors which are typically green, red and blue. In this technology, the OLEDs act as light source and modulator.

OLEDs are produced mainly using a stack of thin layers that have functions characteristic of light-emitting diodes such as an n-doped layer for providing electrons, a p-doped layer for providing holes and an intrinsic recombination layer for emitting the photons. These thin layers are deposited under vacuum or by inkjet directly on a matrix of transistors whose function is to control the current, and therefore the intensity of the light emitted in the OLED at each point of the image. Throughout the rest of the description, this electronic matrix will be called the active matrix.

A third, very promising technology has emerged in recent years: µLEDs or inorganic light-emitting diodes. These diodes are called µLEDs because of their very small sizes, around 100 micrometers.

In this latest technology, the light-emitting diodes are no longer deposited in thin layers on the active matrix. They are discrete components most often made of sapphire, silicon or silicon carbide which are transferred and connected a posteriori to the glass plate which supports the active matrix. These µLEDs then act as light sources and modulators in the same way as OLEDs.

In a display device with LEDs, whether organic or inorganic with an active matrix, it is preferable for the emission of light to take place on the side opposite the active matrix. In this way, the rows, columns and transistors of the active matrix which constitute the control device for the LEDs do not obstruct the transmission of light. The entire surface of the emitter is then used for the emission of light.

However, this requires that the contacts for the LEDs be positioned on the face opposite their emission face. This arrangement presents a number of difficulties in implementation.

In the case of display devices in which the LEDs are discrete components transferred to the active matrix, the method for producing the LEDs on a sapphire or silicon substrate gives components which naturally have their emission surface on the same side as the contacts.

In all cases, producing color components comprising emission on the side opposite the electrical contacts requires thinning or removal of the initial substrate.

This removal or thinning is necessary to allow the transmission of light, for example when the substrate is made of silicon. This removal or thinning is also necessary to allow the production of the color conversion layers on the emission side, for example when the substrate is made of sapphire or of silicon. This leads to multiple transfers of LEDs to various substrates before obtaining a final component whose contact is on the side of the active matrix and whose emission region is on the opposite side through a color conversion layer.

These multiple substrate thinning or transfer operations are expensive. They have a random production yield. They make the component fragile and limit the temperatures and pressures that can be used for the method of joining and connecting the LEDs to the active matrix.

Consequently, display solutions with the LEDs emitting through the active matrix present fewer production difficulties.

The µLED display according to the invention falls within this context, i.e. that of displays emitting through the active matrix. The objective of the invention is threefold:
  Limit the number of steps in producing the LED on its substrate. It is then not necessary to produce a contact on its emission face;
  Reduce the number of contacts between the active matrix and the LEDs;
  Reduce the number of power supplies distributed over the glass plate used as support for the active matrix. Specifically, the power supply via the face opposite the active matrix preferentially passes through a conductive plane moved to this face of the device.

SUMMARY OF THE INVENTION

A subject of the invention is therefore a µLED display comprising a plurality of electronic chips with µLEDs and an active matrix for controlling said chips with µLEDs, the active matrix being mounted on a transparent slide, each chip with µLEDs comprising a plurality of light-emitting diodes, each chip with µLEDs comprising a substrate comprising, on the lower portion thereof, a conductive surface acting as a common electrode and, on the upper portion thereof, the µLEDs and their electrical control contacts, characterized in that the display comprises at least, in this order:
  a support plate comprising a lower face and an upper face;
  one or more first power supply planes arranged on the upper face of the support plate;
  a plurality of first conductive elements;
  the plurality of electronic chips, a first conductive element providing the electrical connection between the common electrode of each chip and a first power supply plane;
  a plurality of second conductive elements, each second conductive element being arranged on an electrical contact for controlling an electronic chip;
  the transparent slide bearing the active matrix, each second conductive element providing the electrical connection between an electrical contact of an electronic chip and an electrical contact for controlling the active matrix.

Advantageously, the power supply plane is common to all of the electronic chips.

Advantageously, a second power supply plane is arranged on the lower face of the support plate.

Advantageously, the second power supply plane is electrically connected to the upper face of the support plate by means of conductive vias providing the electrical connection between the first power supply plane and the second power supply plane.

Advantageously, a heat dissipation element is attached under the support plate.

Advantageously, a third power supply plane is arranged on the lower face of the support plate, said third power supply plane being electrically connected by means of conductive vias to metal or conductive lands which are independent of the first electrical plane or of the second electrical plane and are placed on the upper face of the support plate, a plurality of third conductive elements providing the electrical connection between each via and an electrical contact for the power supply of the active matrix.

Advantageously, the support plate is a multilayer printed circuit comprising a plurality of electrically insulated conductive layers.

Advantageously, the support plate comprises compartments into which the electronic chips are inserted.

Advantageously, the support plate comprises first conductive pads arranged on each via whose height is equal to that of the electronic chips.

Advantageously, the transparent slide comprises second conductive pads arranged facing each via whose height is equal to that of the electronic chips.

Advantageously, the support plate is transparent, the power supply planes being grids comprising conductive pads arranged under the μLEDs.

Advantageously, the support plate is made of glass or of polyethylene terephthalate.

Advantageously, the grids are covered with a light-absorbent material.

Advantageously, the space separating the first power supply plane and the transparent slide bearing the active matrix is filled with a transparent or opaque insulating material.

Advantageously, the chips are all identical, each chip comprising at least three light-emitting diodes, each light-emitting diode emitting in a different spectral band from those of the other two light-emitting diodes.

Advantageously, the chips are of at least three types, each type of chip comprising one or more identical light-emitting diodes, the light-emitting diodes of one type of chip emitting in a different spectral band from those of the light-emitting diodes of the other two types of chip.

BRIEF DESCRIPTION OF THE DRAWINGS

Other features, details and advantages of the invention will become apparent from reading the description, which is given with reference to the appended drawings, which are given by way of example and in which, respectively.

DETAILED DESCRIPTION

Figure 1:
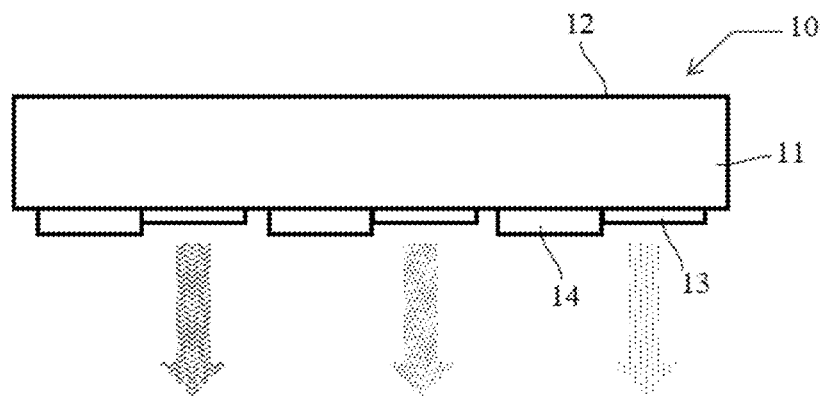
FIG. 1 shows a sectional view of an electronic chip with light-emitting diodes according to the invention.

The display according to the invention consists of a matrix or a mosaic of electronic chips with μLEDs. FIG. 1 shows a sectional view of an electronic chip 10 with μLEDs of this display. This chip comprises a substrate 11 comprising a lower face and an upper face. Preferably, the substrate is conductive and naturally comprises a conductive lower surface 12 which will act as a common electrode for all of the diodes provided that this back face is not oxidized or that the oxidation layer may be treated to promote the making of electrical contact. The substrate is generally made of doped silicon. The upper face bears the emitting μLEDs 13 and their control contacts 14, one contact being associated with each diode. For each diode 13, the electrical control contact 14 is arranged next to said diode so as not to cover a surface of said diode. The emissions of light from the diodes are represented by arrows in this FIG. 1 and the following figures. They are on the same side as the control contacts.

There are various types of chips depending on the associated light-emitting diodes. A first type of chip comprises one or more diode triplets. Each triplet is composed of three light-emitting diodes, each light-emitting diode emitting in a different spectral band from those of the other two light-emitting diodes. Conventionally, one of the diodes emits in the red, a second diode in the green and the third in the blue. Each triplet corresponds to a colored pixel of the imager.

A second type of chip comprises only diodes emitting in the same spectral band. There are then three types of chip depending on the color of emission of their respective diodes. For example, a first type of chip comprises diodes emitting in the red, a second type of chip comprises diodes emitting in the green, and a third type of chip comprises diodes emitting in the blue. By suitably juxtaposing the chips of different types in a periodic mosaic, pixels are created, each comprising a triplet of different colored light-emitting diodes.

The sizes of the electronic chips are of the same order of magnitude as the pixels of the display, i.e. a few hundred microns. The chips generally have a simple geometric shape such as a rectangle, a square, a triangle, a rhombus, a trapezium or a hexagon so as to enable the periodic tiling.

Figure 2:
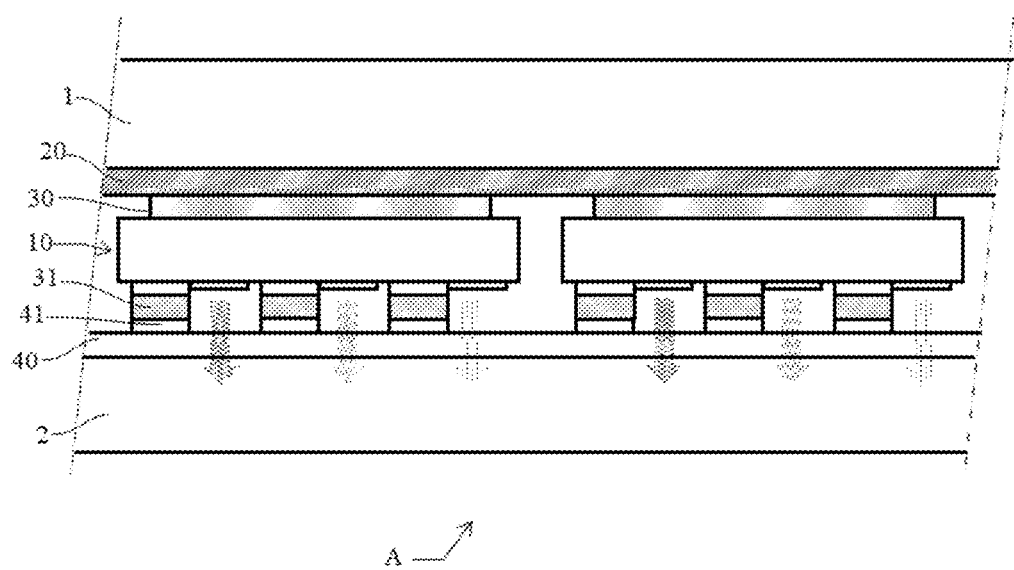
FIG. 2 shows a partial sectional view of a first embodiment of a μLED display according to the invention comprising a power supply plane.

FIG. 2 shows a partial sectional view of a first embodiment of a μLED display A according to the invention. In this view, two chips 10 are shown. The display comprises at least, in this order:

- a support plate 1 comprising a lower face and an upper face;
- one or more first power supply planes 20 arranged on the upper face of the support plate 1;
- a plurality of first conductive elements 30;
- a plurality of electronic chips 10 as defined above, a first conductive element 30 providing the electrical connection between the common electrode of each chip and a first power supply plane 20;
- a plurality of second conductive elements 31, each second conductive element being arranged on an electrical contact for controlling an electronic chip;
- a transparent slide 2 bearing an active matrix 40, each second conductive element 31 providing the electrical connection between an electrical contact of an electronic chip and an electrical contact 41 for controlling the active matrix 40.

The support plate 1 may be made of various materials suitable for bearing a metal conductor. By way of non-limiting examples, glass, epoxy or polyethylene terephthalate, known by the acronym "PET", may be mentioned. The material may be rigid or flexible like PET if its thickness is thin enough. If the display is transparent, the support plate is necessarily made of a transparent material such as glass or PET. Transparent displays make it possible to display an image in superposition on the exterior.

The power supply planes may be made of any type of electrically conductive material. It is preferable to use metals with very low resistivity such as copper or aluminum.

Figure 4:
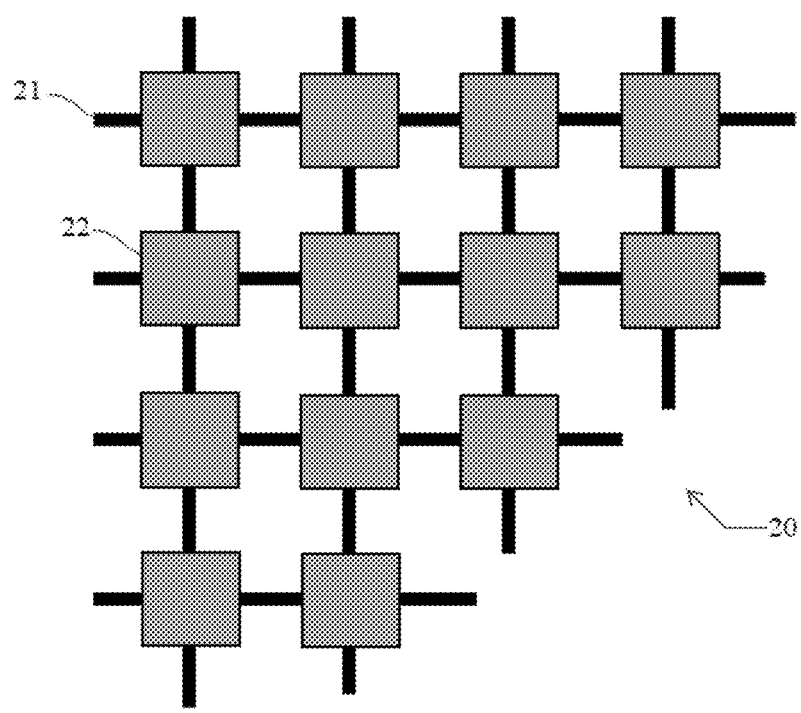
FIG. 4 shows a partial view from above of a power supply plane of a semi-transparent display according to the invention.

If the display is opaque, it is preferable to darken the metal of the power supply planes outside the contact lands for contact with the electrodes in order to reduce reflection of ambient light by the display. If the display is transparent, the footprint of the power supply plane has to be reduced as much as possible. For this purpose, as shown in FIG. 4, the metal plane 20 may be a grid 21 organized into rows and columns comprising mounting lands 22 located at the electrodes so that this grid allows external light through. In the same way, this grid may be darkened in order to reduce stray light.

To reduce access resistance with respect to the center of the display, the conductive plane may be placed on both faces of the support plate with metal holes facing each μLED. These metal holes or vias then have two functions which are:
- homogeneous and uniform voltage distribution over the entire surface of the display;
- removal of the heat generated at each chip. In the latter case, a heat dissipation element may be bonded to the back face. The via then serves as a heat duct between the chip and this heat sink.

The first conductive elements 30 and the second conductive elements 31 are preferably made of conductive adhesive. This may be isotropic or anisotropic. It may be solid, in the form of a strip of adhesive containing small-sized conductive elements laminated onto the conductive plane, or be in the form of a paste containing small-sized conductive elements. The conductive elements may be metal flakes or metal balls, or insulating balls covered with a thin layer of metal. The paste may be placed on the LEDs or on the conductive plane at the precise location of the LEDs by dispensing it using a syringe or by screen printing, for example.

To reduce the risk of short circuits between the conductive plane and the metal tracks on the active matrix, it may be advantageous to fill the space between the LEDs with an insulating material such as resin or adhesive. This material may be transparent or opaque black so as to optically isolate the chips with μLEDs. The filling of this space can be carried out before, during or after the addition of the conductive plane.

It is known that, to supply a diode with power, it is necessary to have a positive supply voltage, often called VDD, and a negative supply voltage, often identified with the ground GND or with VSS, via which the electric current required for the emission of light flows.

High access impedances in the power supply planes cause voltage drops in the conductive planes. They force the use of supply voltages that are significantly higher than the minimum supply voltage for the LEDs and transistors and therefore result in power overconsumption. The two power supply planes may be located on the upper face of the support plate. It is also possible to arrange them on both faces of the support plate.

Figure 3:
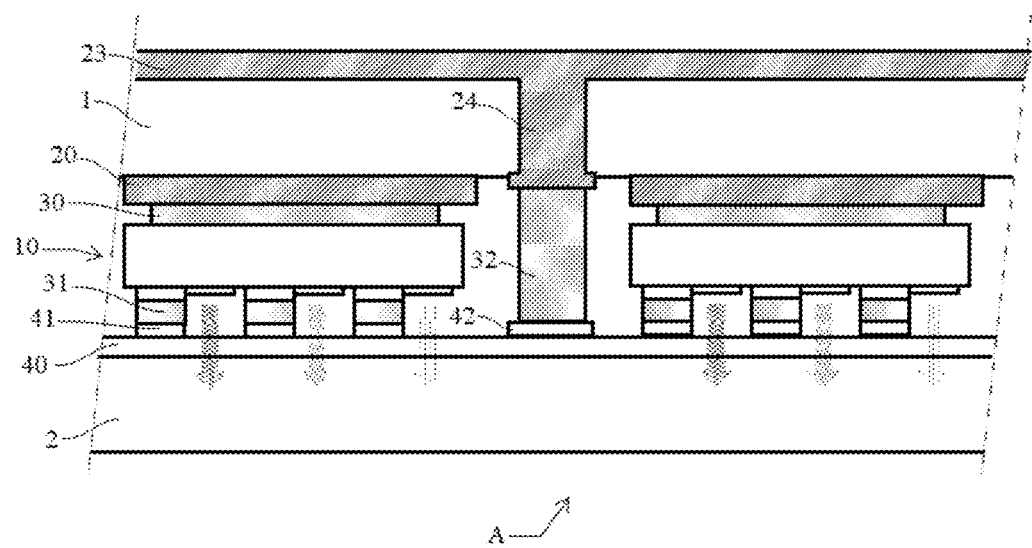
FIG. 3 shows a partial sectional view of a second embodiment of a μLED display according to the invention comprising two power supply planes.

FIG. 3 shows a partial sectional view of one embodiment of a μLED display A according to the invention adopting this arrangement of the power supply planes. In this view, two chips are shown. The various references are the same as in the view of FIG. 2.

In this configuration, a power supply plane 23 is arranged on the lower face of the support plate 1. This power supply plane 23 is electrically connected by means of conductive vias 24 to metal or conductive lands which are independent of the first electrical plane or of the second electrical plane and are placed on the upper face of the support plate, a plurality of third conductive elements 32 providing the electrical connection between each via 24 and an electrical contact 42 for the power supply of the active matrix 40.

One of the voltages is then directly connected to the electrode common to all of the μLEDs on the same chip. The second voltage is connected to the drain or to the source of all of the control transistors of the μLEDs on the active matrix. It is therefore necessary to have two power supplies distributed over the entire device.

However, it is difficult to obtain power supply planes that have low access impedances when they are produced in thin layers with thicknesses of less than 1 μm on the active matrix.

It is preferable to use a support plate with the possibility of supporting multiple electrically insulated metal layers such as a multilayer printed circuit. It is also necessary for the chips supporting the μLEDs to be spaced significantly apart on the active matrix so as to free up space for regions of contact to the power supply plane on the active matrix.

The difficulty in the operation of making contact is due to the fact that the contacts on the active matrix and on the silicon on the back face of the chips are not at the same height, as can be seen in FIG. 3 where the heights of the conductive elements 31 and 32 are different. Four technical solutions are possible to compensate for this difference in height.

The first solution consists in using different volumes of isotropic conductive adhesive depending on whether the adhesive is placed on a contact pad for the power supply plane for the active matrix or for the power supply plane for the silicon on the back face of the LEDs.

The second solution consists in using a printed circuit comprising cavities formed at the location of the LEDs and a metal electrode at the bottom of each cavity in order to accommodate the conductive element for making contact on the silicon. The contact for the power supply for the active matrix is placed on the upper face of the printed circuit as shown in FIG. 3. This allows the same conductive element to be used for both types of contact or for both power supply planes.

The third solution consists in placing metal shims on the printed circuit which add extra thickness with respect to the face of the printed circuit. These shims are placed facing the contact lands for the active matrix.

The fourth solution consists in placing metal elements on the glass plate whose thickness is identical to that of the silicon and connected to the power supply plane for the active matrix. These metal elements distributed over the active matrix are connected on one side to the power supply plane on the glass and on the other side to the contact lands for one of the power supply planes of the printed circuit. In the latter case, the metal pads on the glass may be connected simultaneously and with the same contact solution as the chips supporting the μLEDs. They may be doped silicon pads of the same thickness as those used to support the μLEDs.

The invention claimed is:

1. A μLED display comprising a plurality of electronic chips with μLEDs and an active matrix for controlling said chips with μLEDs, the active matrix being mounted on a transparent slide, each of the plurality of electronic chips with μLEDs comprising a plurality of light-emitting diodes, each of the plurality of electronic chips with μLEDs comprising a substrate comprising, on the lower portion thereof, a conductive surface acting as a common electrode and, on the upper portion thereof, the μLEDs and their individual electrical control contacts, wherein the display comprises at least, in this order:
a support plate comprising a lower face and an upper face;
one or more first power supply planes arranged on the upper face of the support plate;
a plurality of first conductive elements;
the plurality of electronic chips, a first conductive element providing the electrical connection between the common electrode of each of the plurality of electronic chips and the first power supply plane; a plurality of second conductive elements, each second conductive element being arranged on an electrical contact for controlling each of the plurality of electronic chips;
the transparent slide bearing the active matrix, each second conductive element providing the electrical connection between an electrical contact of each of the plurality of electronic chips and an electrical contact for controlling the active matrix.

2. The μLED display as claimed in claim 1, wherein the first power supply plane is common to all of the electronic chips.

3. The μLED display as claimed in claim 1, wherein a second power supply plane is arranged on the lower face of the support plate.

4. The μLED display as claimed in claim 3, wherein said second power supply plane is electrically connected to the upper face of the support plate by means of conductive vias providing the electrical connection between the first power supply plane and the second power supply plane.

5. The μLED display as claimed in claim 3, wherein a heat dissipation element is attached under the support plate.

6. The μLED display as claimed in claim 1, wherein a third power supply plane is arranged on the lower face of the support plate, said third power supply plane being electrically connected by means of conductive vias to metal or conductive lands which are independent of a first electrical plane or of a second electrical plane and are placed on the upper face of the support plate, a plurality of third conductive elements providing the electrical connection between each of the conductive vias and an electrical contact for the third power supply of the active matrix.

7. The μLED display as claimed in claim 6, wherein the support plate is a multilayer printed circuit comprising a plurality of electrically insulated conductive layers.

8. The μLED display as claimed in claim 6, wherein the support plate comprises compartments into which the electronic chips are inserted.

9. The μLED display as claimed in claim 6, characterized in that wherein the support plate comprises first conductive pads arranged on each of the conductive vias whose height is equal to that of the electronic chips.

10. The μLED display as claimed in claim 6, wherein the transparent slide comprises second conductive pads arranged facing each of the conductive vias whose height is equal to that of the electronic chips.

11. The μLED display as claimed in claim 1, wherein the support plate is transparent, the one or more first power supply planes being grids comprising conductive pads arranged under the μLEDs.

12. The μLED display as claimed in claim 11, wherein the support plate is made of glass or of polyethylene terephthalate.

13. The μLED display as claimed in claim 11, wherein the grids are covered with a light-absorbent material.

14. The μLED display as claimed in claim 1, wherein a space separating the first power supply plane and the transparent slide bearing the active matrix is filled with an insulating material.

15. The μLED display as claimed in claim 14, wherein the insulating material is transparent.

16. The μLED display as claimed in claim 14, wherein the insulating material is opaque.

17. The μLED display as claimed in claim 1, wherein the chips are all identical, and the plurality of light emitting diodes comprises at least three light-emitting diodes, each light-emitting diode emitting in a different spectral band from those of the other two light-emitting diodes.

18. The μLED display as claimed in claim 1, wherein the chips are of at least three types, the plurality of light emitting diodes comprises identical light-emitting diodes, and the light-emitting diodes of one type of the chips emit in a different spectral band from those of the light-emitting diodes of the other two types of chips.

* * * * *